(12) United States Patent
Mori et al.

(10) Patent No.: US 7,087,967 B2
(45) Date of Patent: Aug. 8, 2006

(54) LSI DEVICE HAVING CORE AND INTERFACE REGIONS WITH SOI LAYERS OF DIFFERENT THICKNESS

(75) Inventors: Toru Mori, Miyagi (JP); Masao Okihara, Tokyo (JP); Shinobu Takehiro, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/648,784

(22) Filed: Aug. 27, 2003

(65) Prior Publication Data
US 2004/0070032 A1  Apr. 15, 2004

(30) Foreign Application Priority Data
Sep. 2, 2002 (JP) .............................. 2002-256510

(51) Int. Cl.
*H01L 27/01* (2006.01)
(52) U.S. Cl. ..................... 257/348; 257/203; 257/392; 257/500; 257/E27.061; 257/E21.631
(58) Field of Classification Search ................ 257/347, 257/348, 341, 350, 357, 349, 351, 202, 203, 257/204, 205, 206, 500, 501, 507, 392, 504, 257/E27.061, E21.631
See application file for complete search history.

(56) References Cited

U.S. PATENT DOCUMENTS

| 5,463,238 A | 10/1995 | Takahashi et al. |
| 5,574,292 A | 11/1996 | Takahashi et al. |
| 6,043,536 A * | 3/2000 | Numata et al. ............. 257/347 |
| 6,111,427 A | 8/2000 | Fujii et al. ..................... 326/34 |
| 6,222,234 B1 * | 4/2001 | Imai ........................... 257/347 |
| 6,426,261 B1 | 7/2002 | Fujii et al. .................. 438/276 |

FOREIGN PATENT DOCUMENTS

| JP | 01-122154 | 5/1989 |
| JP | 05-075041 | 3/1993 |
| JP | 05243510 A | 9/1993 |
| JP | 06-261265 | 10/1994 |
| JP | 09-135030 | 5/1997 |
| JP | 10-065517 | 3/1998 |
| JP | 11-330482 | 11/1999 |

* cited by examiner

*Primary Examiner*—Minhloan Tran
*Assistant Examiner*—Tan Tran
(74) *Attorney, Agent, or Firm*—VolentineFrancos&Whitt,PLLC (57) ABSTRACT

An LSI device includes a core region to which a first driving voltage is applied and an interface region to which a second driving voltage higher than the above first driving voltage is applied. The LSI device includes an SOI substrate and a device separation region for separating a SOI layer of the SOI substrate into the core region and the interface region. The thickness of the SOI layer of the core region is thinner than the thickness of the SOI layer of the interface region. The LSI device further includes first MOSFETs formed in the core region and in which the SOI layer of the core region is a fully depleted Si channel and second MOSFETs formed in the interface region and in which the SOI layer of the interface region is a fully depleted Si channel.

6 Claims, 9 Drawing Sheets

LSI DEVICE HAVING CORE AND INTERFACE REGIONS WITH SOI LAYERS OF DIFFERENT THICKNESS

BACKGROUND OF THE INVENTION

The present invention relates to an LSI device comprising a fully depleted silicon on insulator (FDSOI) MOS field-effect transistor (MOSFET) and a manufacturing method thereof.

There has been conventionally proposed a semiconductor device in which the film thickness of a first semiconductor active layer provided with a P channel MOSFET is made thinner than that of a second semiconductor active layer provided with an NMOSFET (refer to JP-A-1-122154, Page 2, Lower-right column, FIG. 1). There has also been a proposal that an FDSOI-MOSFET is used as a MOSFET forming an LSI device in order to achieve reduction of consumption power and high-speed in an operation of an LSI device (refer to JP-A-6-291265, Paragraph 0049, FIG. 15). An FDSOI-MOSFET can not only achieve a sub-threshold characteristic close to a theoretical limit, but also reduce sub-threshold leak current by around one figure, compared with a bulk CMOS device. Furthermore, an FDSOI-MOSFET is different from a partly depleted (PD) SOI-MOSFET in that no kink phenomena due to impact ionization occur, and is superior to a PDSOI-MOSFET in a frequency characteristic of delay time and in stability against active plate floating effect such as pass-gate leak.

As described above, an FDSOI-MOSFET can simultaneously achieve reduction of consumption power and high-speed in an operation while it has a disadvantage that short channel effect is significant. It is effective to make the film thickness of a SOI layer thinner in order to restricting the short channel effect. Thinning of the film thickness of a SOI layer, however, causes reduction of the threshold voltage of a MOSFET, so that its operation would be unstable. Therefore, it is required to adjust the threshold voltage by injecting in a channel region channel impurities at high concentration.

In a MOSFET in which a channel length is long, however, increase of channel impurities easily causes PD. PD of a MOSFET causes kink phenomena, so that a linear characteristic of an operation of a MOSFET would be lost and a circuit operation would become unstable, which causes significant difficulty in LSI designing.

The invention is for solving problems in the related art as described above. An object of the invention is to provide an LSI device capable of achieving reduction of consumption power, high-speed of an operation and stability in a circuit operation and a method of manufacturing such LSI device.

SUMMARY OF THE INVENTION

An LSI device in accordance with the invention includes a core region to which a first driving voltage is applied and an interface region to which a second driving voltage higher than the above first driving voltage is applied. The LSI device includes an SOI substrate and a device separation region for separating a SOI layer of the SOI substrate into the core region and the interface region. The thickness of the SOI layer of the core region is thinner than the thickness of the SOI layer of the interface region. The LSI device further includes first MOSFETs formed in the core region and in which the SOI layer of the core region is a fully depleted Si channel and second MOSFETs formed in the interface region and in which the SOI layer of the interface region is a fully depleted Si channel.

BRIEF DESCRIPTION OF THE DRAWINGS

Other features and advantages of the present invention will appear more clearly upon reading the following detailed description, made with reference to the annexed drawings in which.

DETAILED DESCRIPTION OF THE INVENTION

First Embodiment

FIGS. 1A to 1K are a schematic sectional view illustrating a manufacturing process (from 1 to 11) of an LSI device in accordance with a first embodiment of the invention.

Figure 2:
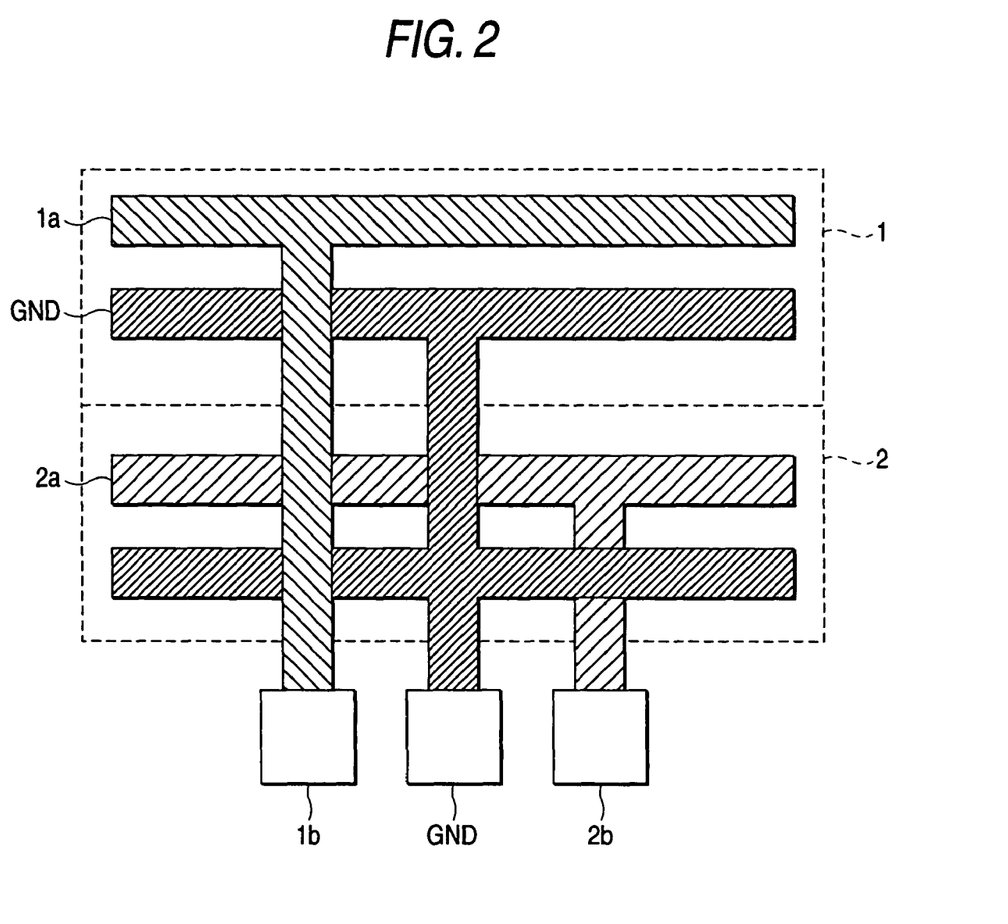
FIG. 2 is a schematic plan view showing a structure of respective power applying wires in a core region and an I/O region of an LSI device in accordance with a first embodiment of the invention.

An LSI device in accordance with a first embodiment includes a high-speed computing portion (a core region) 1 required to operate at low voltage and high speed and a data input/output portion (an interface region or an I/O region) 2, which is a region other than the core region 1 and whose source voltage is high. In the first embodiment, a SOI layer is formed thickly in the I/O region 2 in which the channel length (the gate length) is long while it is formed thinly in the core region 1 in which the channel length is short. FIG. 2 is a schematic plan view showing a structure of respective power applying wires in a core region 1 and an I/O region 2 of a MOSFET device in accordance with a first embodiment. As shown in FIG. 2, a ground wiring GND and a core source wiring 1a are provided in the core region 1. In the I/O region 2, provided are a ground wiring GND and an I/O source wiring 2a. Core driving voltage $V_{CORE}$ is applied to the core region 1 through a core source terminal (or a core source circuit) 1b and the core source wiring 1a. I/O driving voltage $V_{I/O}$ is applied to the I/O region 2 through an I/O source terminal (or an I/O source circuit) 2b and the I/O source wiring 2a. The core driving voltage $V_{CORE}$ is set lower than the I/O driving voltage $V_{I/O}$ in the first embodiment. The core driving voltage $V_{CORE}$ is 1.5 V and the I/O driving voltage $V_{I/O}$ is 3.3 V (or 2.5 V), for example.

Figure 1A:
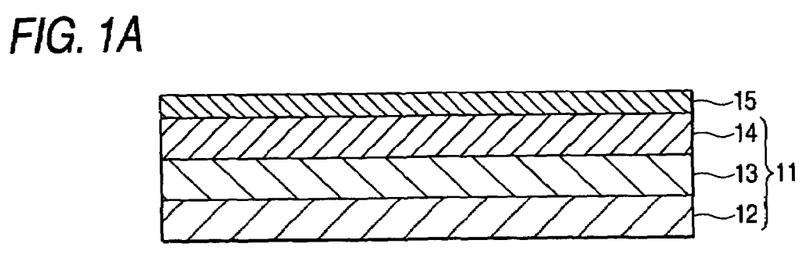
FIGS. 1A to 1K are a schematic sectional view illustrating a manufacturing process of an LSI device in accordance with a first embodiment of the invention.
Figure 1B:
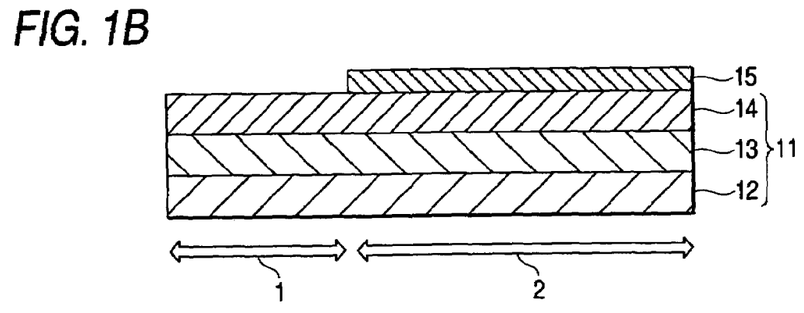
Figure 1C:
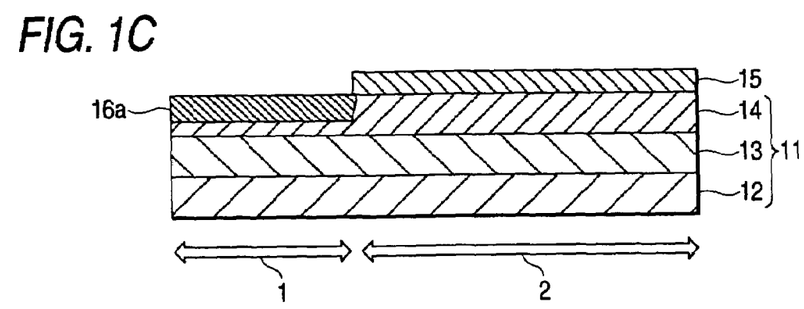

An LSI device in accordance with the first embodiment is formed on a SOI substrate (a SOI wafer) 11 comprising an Si substrate 12, a buried oxide film (a BOX film) 13 and a SOI layer (a silicon layer) 14.

Figure 1D:
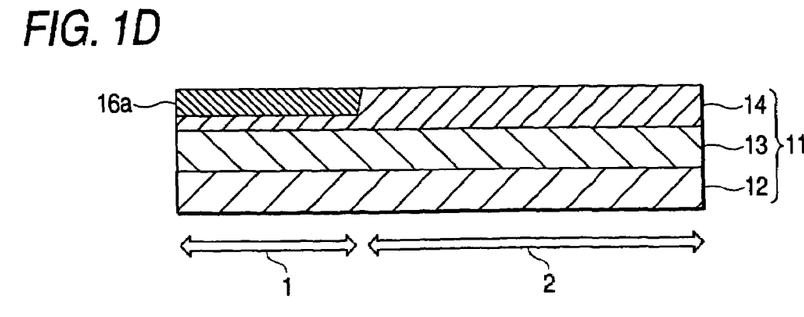
Figure 1E:
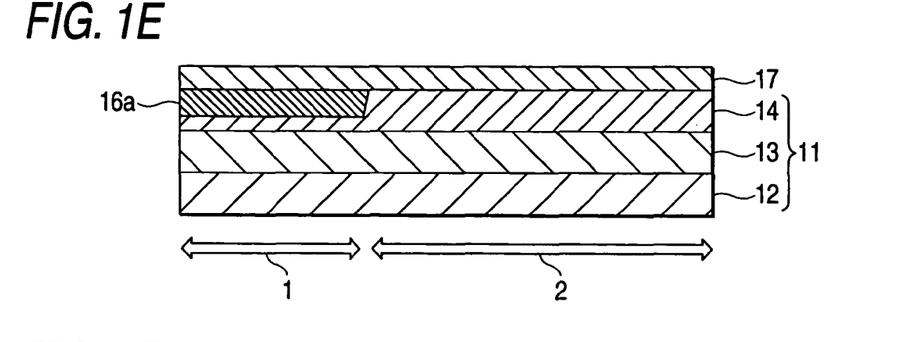
Figure 1F:
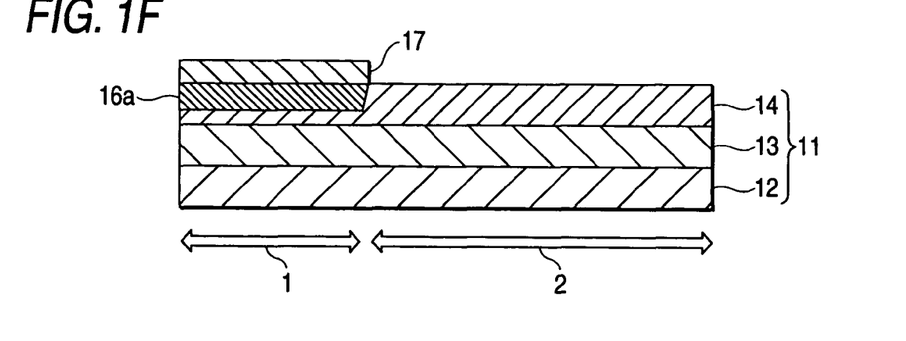
Figure 1G:
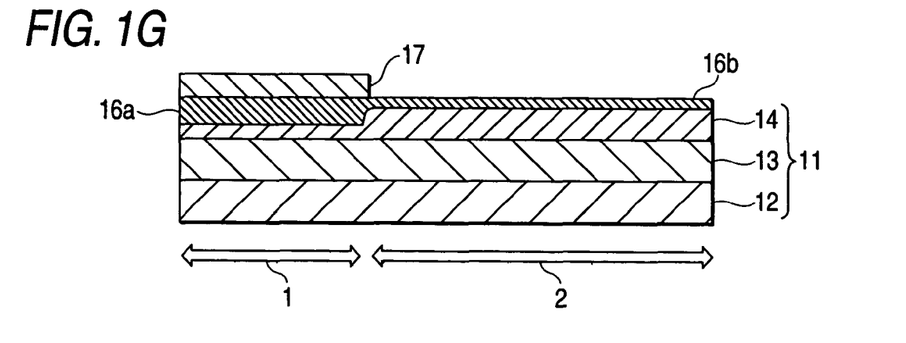

In manufacturing an LSI device in accordance with the first embodiment, the vicinity of a surface of the SOI layer 14 is first oxidized selectively to form an oxide film 16a, as shown in FIGS. 1A to 1D. A process of forming the oxide film 16a comprises, for example, steps of forming a nitride film 15 as an antioxidant mask all over the SOI layer 14 by means of the CVD (chemical vapor deposition) method (FIG. 1A), eliminating a part of the nitride film 15 (an area to be the core region 1) by photolithography and etching (FIG. 1B), oxidizing (thermal-oxidizing, for example: same, hereinafter) the vicinity of a surface of the SOI layer 14 exposed by eliminating the nitride film 15 to form the oxide film 16a (FIG. 1C) and eliminating the nitride film 15 (FIG. 1D).

Figure 1H:
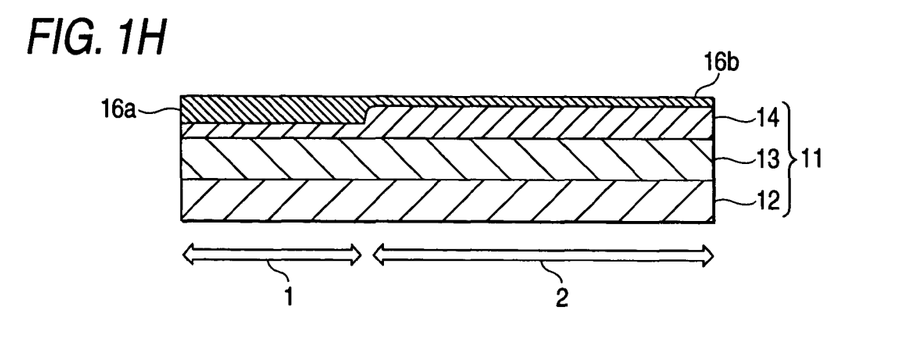

Then, the vicinity of a surface of the SOI layer 14 is selectively oxidized to form an oxide film 16b in the I/O region 2, as shown in FIGS. 1E to 1H. The thickness of the oxide film 16b is made thinner than that of the oxide film 16a in the core region 1. A process of forming the oxide film 16b comprises, for example, steps of forming a nitride film 17 as an antioxidant mask all over the SOI layer 14 by means of the CVD method (FIG. 1E), eliminating a part of the nitride film 17 (an area to be the I/O region 2) by photolithography and etching (FIG. 1F), oxidizing the vicinity of a surface of the SOI layer 14 exposed by eliminating the nitride film 17 to form the oxide film 16b (FIG. 1G) and eliminating the nitride film 17 (FIG. 1H). The order of forming the oxide films 16a and 16b may be reverse to the above.

Figure 1I:
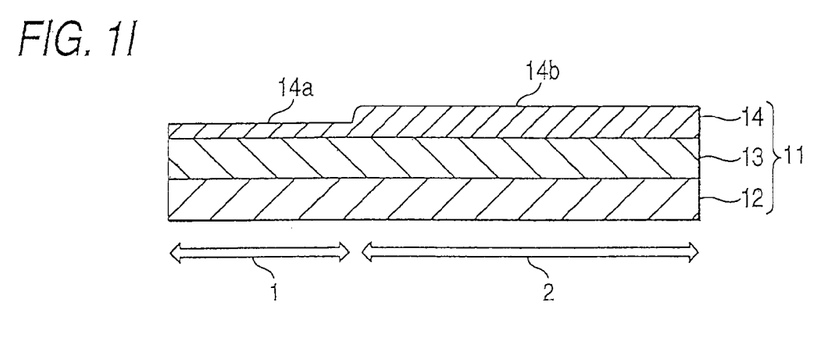

Next, as shown in FIG. 1I, the oxide films 16a and 16b are eliminated by wet etching to form a thin SOI layer 14a in the core region 1 and a SOI layer 14b thicker than the SOI layer 14a in the I/O region 2. The thickness of the thin SOI layer 14a is 30 nm or less (in the case that the channel length is around 0.1 μm), for example. The thickness of the thick SOI layer 14b is around 50 nm (in the case that the channel length is 0.2 μm or more), for example. The thickness of the SOI layers 14a and 14b is, however, not limited to the above.

Figure 1J:
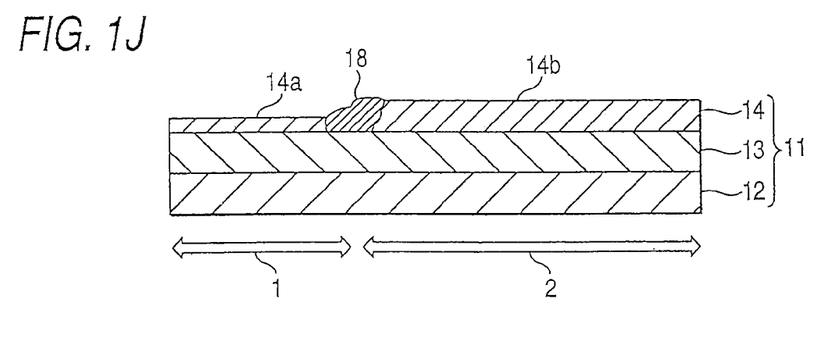

As shown in FIG. 1J, a device separation region 18 for separating the SOI layers 14a and 14b is then formed between the core region 1 and the I/O region 2. The device separation region 18 is formed by means of a LOCOS (local oxidation of silicon) method, a shallow trench isolation (STI) method or such, for example.

Figure 1K:
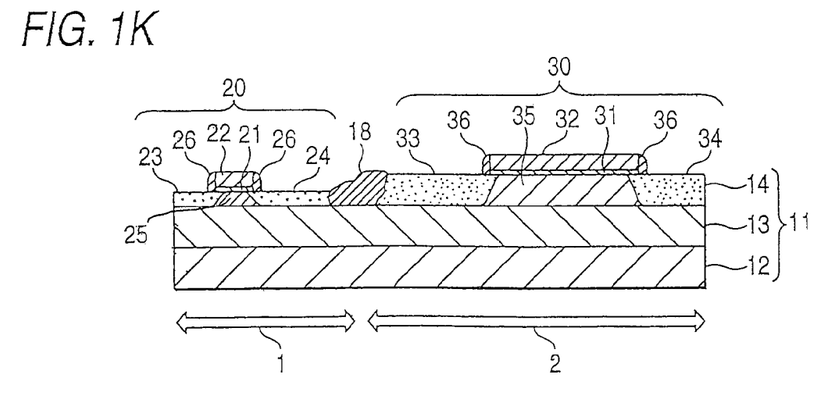

As shown in FIG. 1K, in a usual MOSFET forming process (including a channel impurity adjusting process), a plurality of MOSFETs 20 (only one MOSFET 20 is shown in FIG. 1K) in which the thin SOI layer 14a is a fully depleted Si channel are formed in the core region 1 while a plurality of MOSFETs 30 (only one MOSFET 30 is shown in FIG. 1K) in which the thick SOI layer 14b is a fully depleted Si channel are formed in the I/O region 2. The MOSFETs 20 and the MOSFETs 30 may be formed in a same process simultaneously or in a different process in order.

The MOSFET 20 includes a gate oxide film 21, a gate electrode layer 22, a source region 23 and a drain region 24 formed by injecting impurities (As or B, for example), a fully depleted Si channel 25 (the SOI layer 14a) and a side wall insulation film 26, as shown in FIG. 1K. The channel length of the MOSFET 20 is, but not limited to, 0.1 μm, for example. The MOSFET 30 includes a gate oxide film 31, a gate electrode layer 32, a source region 33 and a drain region 34 formed by injecting impurities (As or B, for example), a fully depleted Si channel 35 (the SOI layer 14b) and a side wall insulation film 36, as shown in FIG. 1K. The channel length of the MOSFET 30 is, but not limited to, 0.2 μm or more, for example.

As described above, in accordance with the LSI device according to the first embodiment, the channel length of the MOSFET 20 in the core region 1 is short, so that reduction of consumption power and high-speed operation can be achieved. Furthermore, adjusting channel impurities allows the short channel effect to be restrained since the film thickness of the SOI layer 14a to be the Si channel 25 of the MOSFET 20 is thin in the core region 1 where the channel length is short, as shown in FIG. 2, so that a stable circuit operation in the core region 1 can be achieved. Moreover, the film thickness of the SOI layer 14b to be the Si channel 35 of the MOSFET 30 is thick in the I/O region 2 where the MOSFET 30 having long channel length is formed, so that increase of the channel impurities can be restrained. Therefore, PD of the MOSFET 30 can be prevented from occurring, which allows a stable circuit operation in the I/O region 2 to be achieved.

In accordance with the manufacturing method of an LSI device according to the first embodiment, the film thickness of the SOI layers 14a and 14b can be controlled to be a desired value by adjusting the oxidation amount in a process of forming an oxide film (the thickness of the oxide films 16a and 16b), so that the film thickness of an Si channel of a MOSFET of the LSI device to be manufactured can be optionally set in accordance with the channel length or the voltage of a driving source. Thus, the film thickness of the Si channel can be formed so as to correspond to a characteristic required for each region of the LSI device, and therefore, it is possible in manufacturing to maintain voltage-proof in the I/O region, for example, in which the channel length is long and high voltage is applied.

Second Embodiment

FIGS. 3A to 3H are a schematic sectional view illustrating a manufacturing process (from 1 to 8) of an LSI device in accordance with a second embodiment of the invention.

Figure 3A:
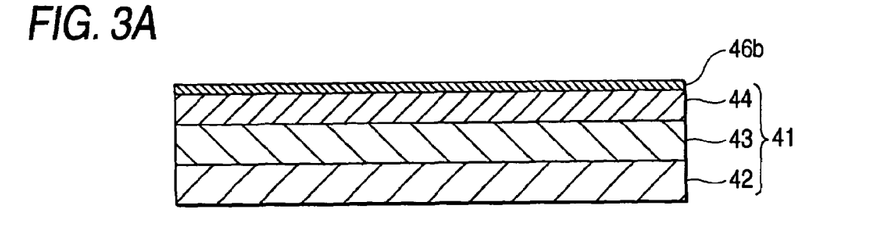
FIGS. 3A to 3H are a schematic sectional view illustrating a manufacturing process of an LSI device in accordance with a second embodiment of the invention.
Figure 3B:
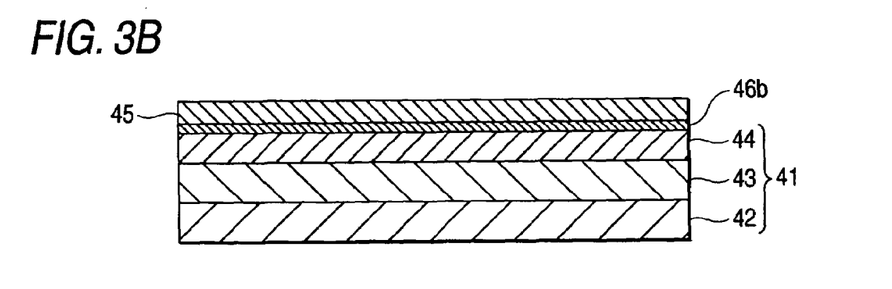
Figure 3C:
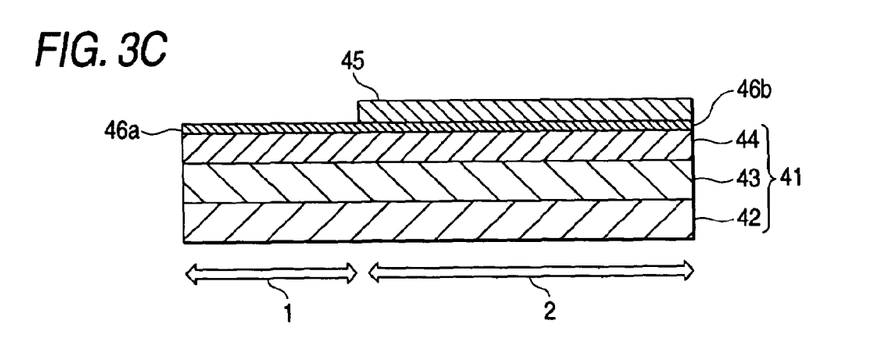
Figure 3D:
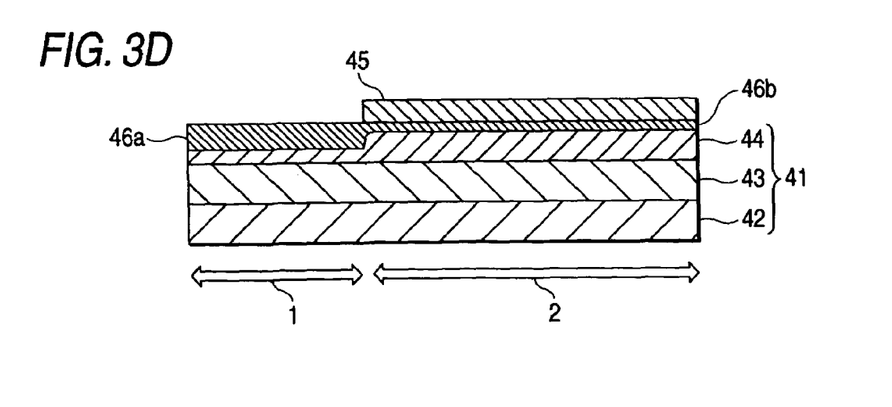

The LSI device in accordance with the second embodiment includes a high-speed computing portion (a core region) 1 required to operate at low voltage and high speed and a data input/output portion (an interface region or an I/O region) 2, which is a region other than the core region 1 and whose source voltage is high. In the second embodiment, a SOI layer is formed thickly in the I/O region 2 in which the channel length (or the gate length) is long while it is formed thinly in the core region 1 in which the channel length is short. A structure of respective power applying wires in the core region 1 and the I/O region 2 of a MOSFET device in accordance with the second embodiment is same as that of the first embodiment described above.

An LSI device in accordance with the second embodiment is formed on a SOI substrate (a SOI wafer) 41 comprising an Si substrate 42, a buried oxide film (a BOX film) 43 and a SOI layer (a silicon layer) 44.

In manufacturing an LSI device in accordance with the second embodiment, the vicinity of a surface of the SOI layer 44 of the SOI substrate 41 is first oxidized evenly to form an oxide film 46b in areas to be the core region 1 and the I/O region 2, as shown in FIG. 3A.

Figure 3E:
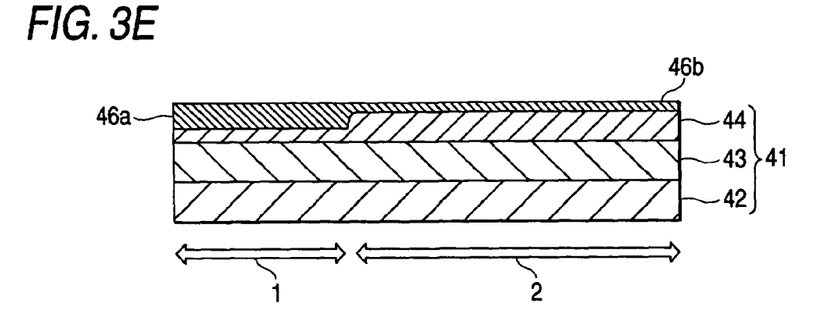

The vicinity of a surface of the SOI layer 44 is then oxidized selectively to increase the thickness of the oxide film in the area to be the core region 1 so that an oxide film 46a whose thickness is thicker than that of the oxide film 46b would be formed, as shown in FIGS. 3B to 3E. A process of forming the oxide film 46a comprises, for example, steps of forming a nitride film 45 as an antioxidant mask all over the oxide film 46b of the SOI layer 44 by means of the CVD method (FIG. 3B), eliminating a part of the nitride film 45 (an area to be the core region 1) by photolithography and etching (FIG. 3C), oxidizing the vicinity of a surface of the SOI layer 44 exposed by eliminating the nitride film 45 to increase the thickness of the oxide film 46b so as to form the oxide film 46a (FIG. 3D) and eliminating the nitride film 45 (FIG. 3E).

Figure 3F:
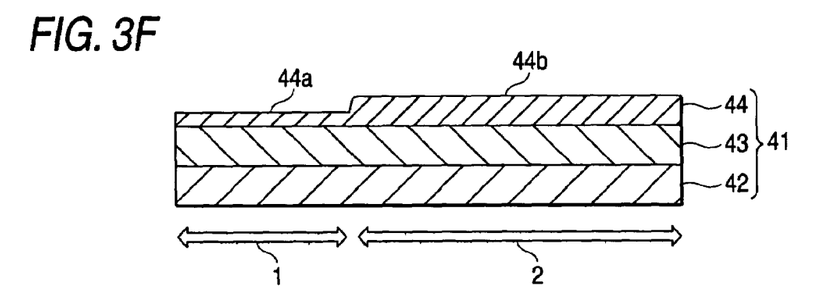

The oxide films 46a and 46b are eliminated by wet etching to form a thin SOI layer 44a in the core region 1 and a SOI layer 44b thicker than the SOI layer 44a in the I/O region 2, as shown in FIG. 3F. The thickness of the thin SOI layer 44a is 30 nm or less (in the case that the channel length is around 0.1 μm), for example. The thickness of the thick SOI layer 44b is around 50 nm (in the case that the channel length is 0.2 μm or more), for example. The thickness of the SOI layers 44a and 44b is, however, not limited to the above.

Figure 3G:
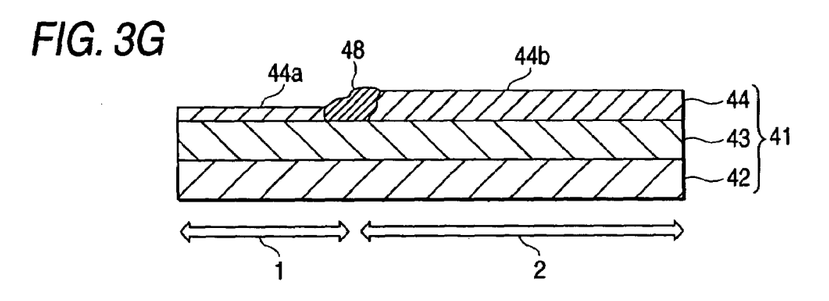

Next, as shown in FIG. 3G, a device separation region 48 for separating the SOI layers 44a and 44b is formed between the core region 1 and the I/O region 2. The device separation region 48 is formed by means of a LOCOS method, an STI method or such, for example.

Figure 3H:
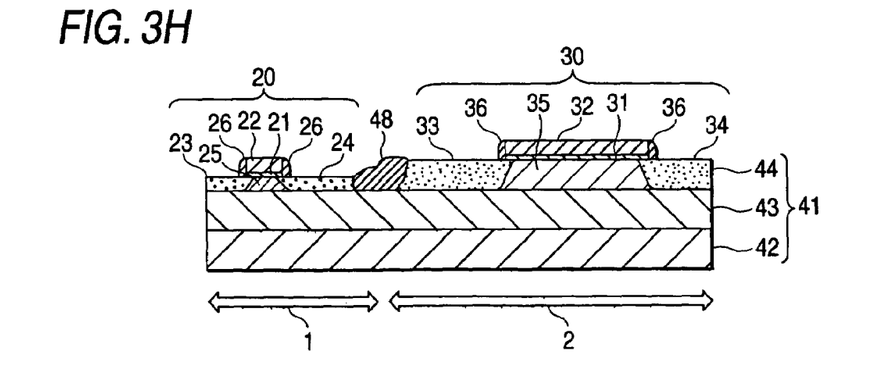

As shown in FIG. 3H, a plurality of MOSFETs 20 (only one MOSFET 20 is shown in FIG. 3H) in which the thin SOI layer 44a is a fully depleted Si channel are formed in the core region 1 while a plurality of MOSFETs 30 (only one MOSFET 30 is shown in FIG. 3H) in which the thick SOI layer 44b is a fully depleted Si channel are formed in the I/O region 2. The MOSFETs 20 and the MOSFETs 30 may be formed in a same process simultaneously or in a different process in order. Structures of the MOSFET 20 and the MOSFET 30 are same as those of the first embodiment.

As described above, in accordance with the LSI device according to the second embodiment, the channel length of the MOSFET 20 in the core region 1 is short, so that reduction of consumption power and high-speed operation can be achieved. Furthermore, adjusting channel impurities allows the short channel effect to be restrained since the film thickness of the SOI layer 44a to be the Si channel 25 of the MOSFET 20 is thin in the core region 1 where the channel length is short, so that a stable circuit operation in the core region 1 can be achieved. Moreover, the film thickness of the SOI layer 44b to be the Si channel 35 of the MOSFET 30 is thick in the I/O region 2 where the MOSFET 30 having long channel length is formed, so that increase of the channel impurities can be restrained. Therefore, PD of the MOSFET 30 can be prevented from occurring, which allows a stable circuit operation in the I/O region 2 to be achieved.

In accordance with the manufacturing method of an LSI device according to the second embodiment, the film thickness of the SOI layers 44a and 44b can be controlled to be a desired value by adjusting the oxidation amount in a process of forming an oxide film (the thickness of the oxide films 46a and 46b), so that the film thickness of an Si channel of a MOSFET of the LSI device to be manufactured can be optionally set in accordance with the channel length or the voltage of a driving source. Thus, the film thickness of the Si channel can be formed so as to correspond to a characteristic required for each region of the LSI device, and therefore, it is possible in manufacturing to maintain voltage-proof in the I/O region, for example, in which the channel length is long and high voltage is applied.

Moreover, in accordance with the manufacturing method of an LSI device according to the second embodiment, a process of forming a nitride film is only carried out once (only the nitride film 45 shown in FIG. 3B), so that it is possible to more simplify a manufacturing process than in the first embodiment.

Third Embodiment

FIGS. 4A to 4I are a schematic sectional view illustrating a manufacturing process (from 1 to 9) of an LSI device in accordance with a third embodiment of the invention.

Figure 4A:
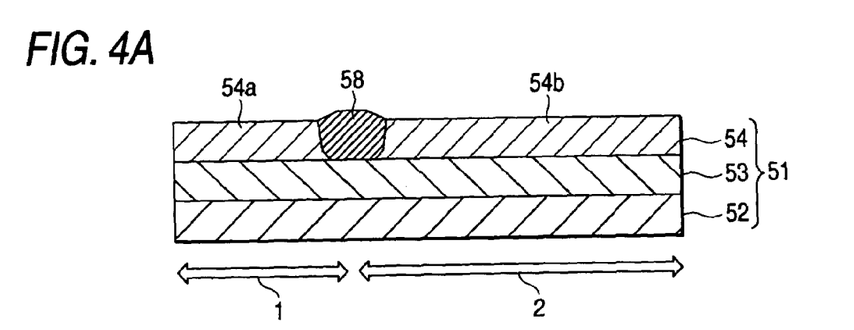
FIGS. 4A to 4I are a schematic sectional view illustrating a manufacturing process of an LSI device in accordance with a third embodiment of the invention.

The LSI device in accordance with the third embodiment includes a high-speed computing portion (a core region) 1 required to operate at low voltage and high speed and a data input/output portion (an interface region or an I/O region) 2, which is a region other than the core region 1 and whose source voltage is high. In the third embodiment, a SOI layer 54b is formed thickly in the I/O region 2 in which the channel length (or the gate length) is long while a SOI layer 54c (54a) is formed thinly in the core region 1 in which the channel length is short. A structure of respective power applying wires in the core region 1 and the I/O region 2 of a MOSFET device in accordance with the third embodiment is same as that of the first embodiment described above.

An LSI device in accordance with the third embodiment is formed on a SOI substrate (a SOI wafer) 51 comprising an Si substrate 52, a buried oxide film (a BOX film) 53 and a SOI layer (a silicon layer) 54.

In manufacturing an LSI device in accordance with the third embodiment, a device separation region 58 for separating the SOI layer 54 of the SOI substrate 51 into the SOI layer 54a to be the core region 1 and the SOI layer 54b to be the I/O region 2 is first formed as shown in FIG. 4A. The device separation region 58 is formed by means of a LOCOS method, an STI method or such, for example.

Figure 4B:
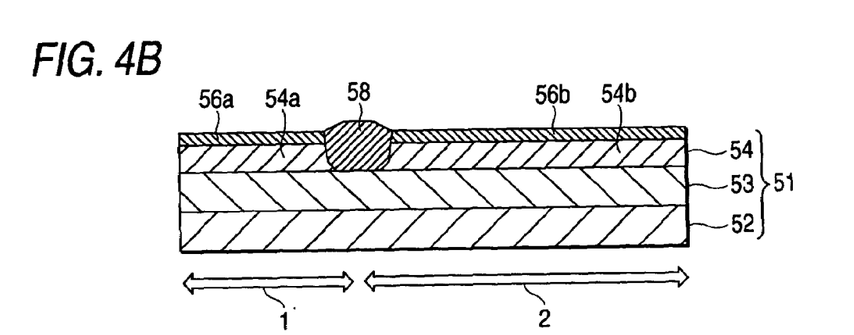

The vicinity of a surface of the SOI layers 54a and 54b is then oxidized evenly to form oxide films 56a and 56b in areas to be the core region 1 and the I/O region 2, as shown in FIG. 4B.

Figure 4C:
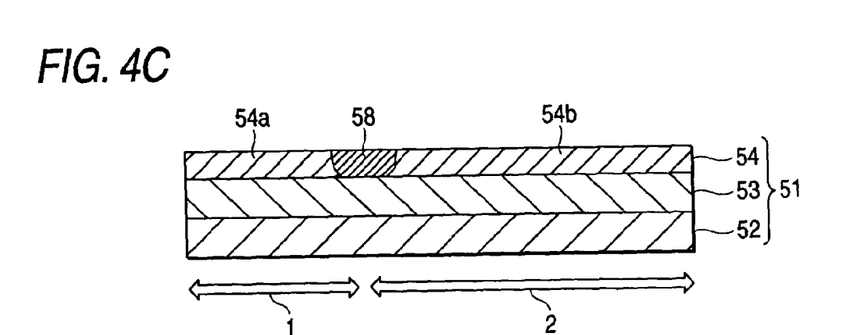
Figure 4D:
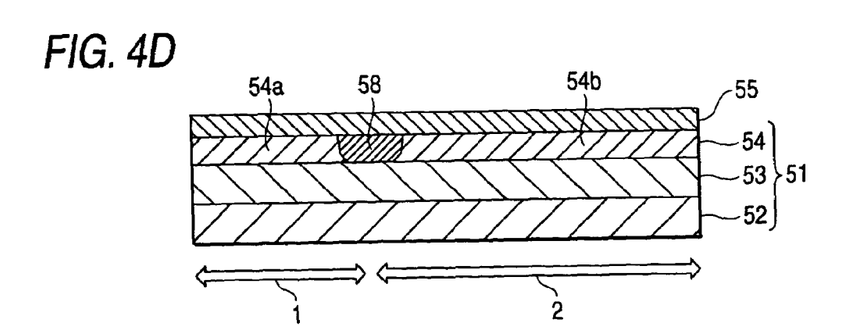
Figure 4E:
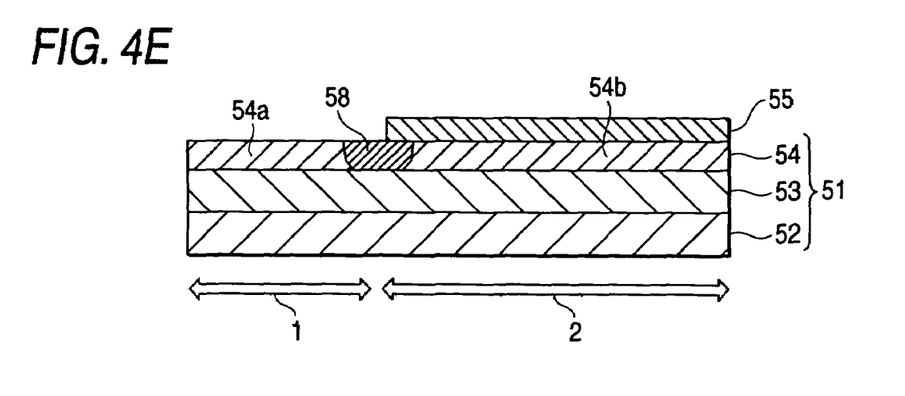
Figure 4F:
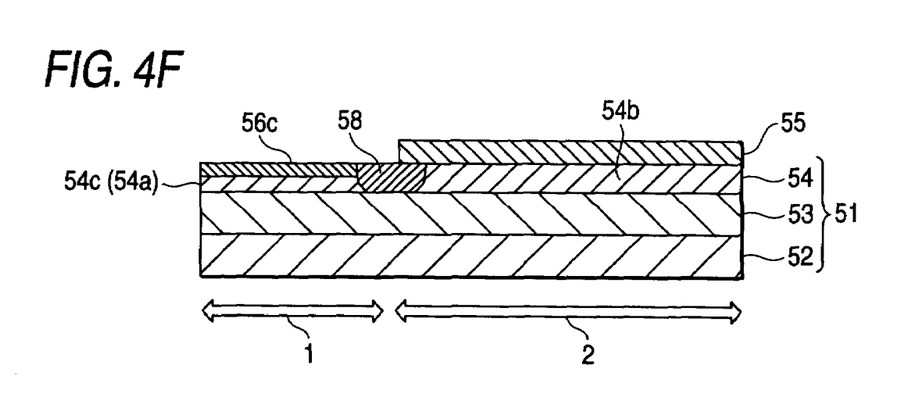

Next, the top portion of the device separation region 58 and the oxide films 56a and 56b are eliminated by means of a chemical mechanical polishing (CMP) method to even the SOI layers 54a and 54b and the top portion of the device separation region 58, as shown in FIG. 4C.

Figure 4G:
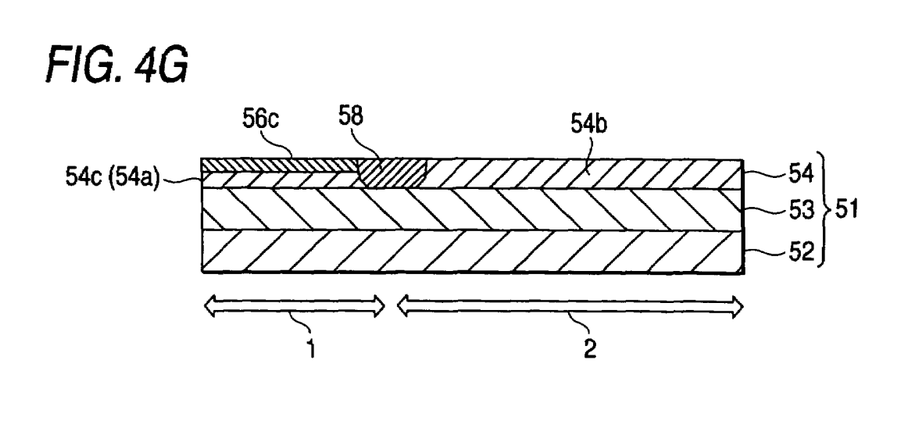

The vicinity of a surface of the SOI layer 54a is then oxidized to form an oxide film 56c in the area to be the core region 1, as shown in FIGS. 4D to 4G. A process of forming the oxide film 56c comprises, for example, steps of forming a nitride film 55 as an antioxidant mask all over the SOI layer 54a, the device separation region 58 and the SOI layer 54b by means of the CVD method (FIG. 4D), eliminating a part of the nitride film 55 (the area to be the core region 1) by photolithography and etching (FIG. 4E), oxidizing the vicinity of a surface of the SOI layer 54a exposed by eliminating the nitride film 55 to form the oxide film 56c (FIG. 4F) and eliminating the nitride film 55 (FIG. 4G).

Figure 4H:
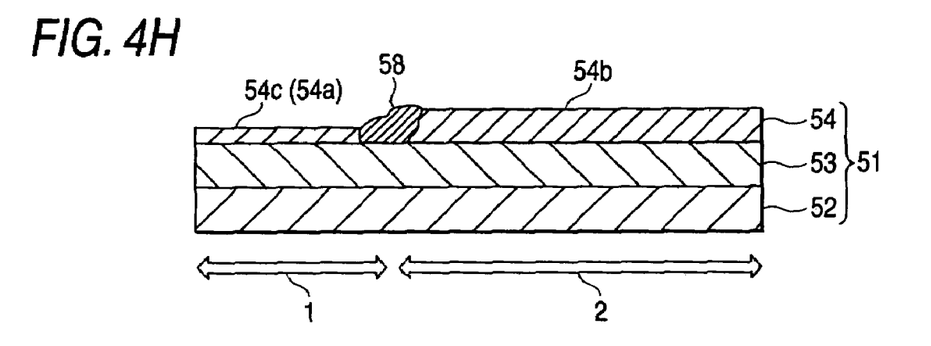

As shown in FIG. 4H, the oxide films 56c is eliminated by wet etching to form the thin SOI layer 54c (a part of the SOI layer 54a) in the core region 1. The SOI layer 54b thicker than the SOI layer 54c has been formed in the I/O region 2 at that time. The thickness of the thin SOI layer 54c is 30 nm or less (in the case that the channel length is around 0.1 μm), for example. The thickness of the thick SOI layer 54b is around 50 nm (in the case that the channel length is 0.2 μm or more), for example. The thickness of the SOI layers 54c and 54b is, however, not limited to the above.

Figure 4I:
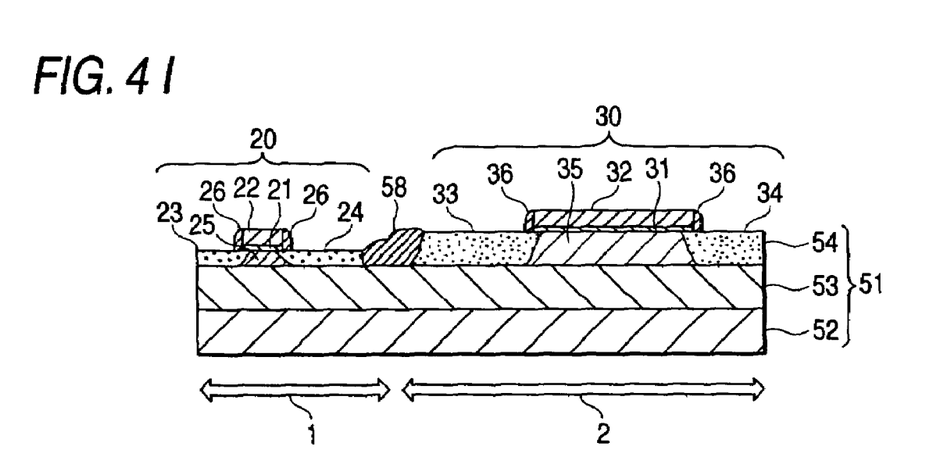

A plurality of MOSFETs 20 (only one MOSFET 20 is shown in FIG. 4I) in which the thin SOI layer 54c is a fully depleted Si channel are then formed in the core region 1 while a plurality of MOSFETs 30 (only one MOSFET 30 is shown in FIG. 4I) in which the thick SOI layer 54b is a fully depleted Si channel are formed in the I/O region 2, as shown in FIG. 4I. The MOSFETs 20 and the MOSFETs 30 may be formed in a same process simultaneously or in a different process in order. Structures of the MOSFET 20 and the MOSFET 30 are same as those of the first embodiment.

As described above, in accordance with the LSI device according to the third embodiment, the channel length of the MOSFET 20 in the core region 1 is short, so that reduction of consumption power and high-speed operation can be achieved. Furthermore, adjusting channel impurities allows the short channel effect to be restrained since the film thickness of the SOI layer 54c to be the Si channel 25 of the MOSFET 20 is thin in the core region 1 where the channel length is short, so that a stable circuit operation in the core region 1 can be achieved. Moreover, the film thickness of the SOI layer 54b to be the Si channel 35 of the MOSFET 30 is thick in the I/O region 2 where the MOSFET 30 having long channel length is formed, so that increase of the channel impurities can be restrained. Therefore, PD of the MOSFET 30 can be prevented from occurring, which allows a stable circuit operation in the I/O region 2 to be achieved.

In accordance with the manufacturing method of an LSI device according to the third embodiment, the film thickness of the SOI layers 54c and 54b can be controlled to be a desired value by adjusting the oxidation amount in a process of forming an oxide film (the thickness of the oxide films 56a, 56b and 56c), so that the film thickness of an Si channel of a MOSFET of the LSI device to be manufactured can be optionally set in accordance with the channel length or the voltage of a driving source. Thus, the film thickness of the Si channel can be formed so as to correspond to a characteristic required for each region of the LSI device, and therefore, it is possible in manufacturing to maintain voltage-proof in the I/O region, for example, in which the channel length is long and high voltage is applied.

Moreover, in accordance with the manufacturing method of an LSI device according to the third embodiment, a polishing process using the CMP method is carried out after forming the device separation region 58 by means of the LOCOS method, so that bird's beak can be eliminated. Furthermore, the polishing process using the CMP method allows stress on a SOI layer to be reduced even in the case that the device separation region 58 formed by means of the LOCOS method causes stress on the SOI layer, and thereby, characteristic deterioration of an NMOS.

As described above, in accordance with the LSI device according to the invention, the channel length of a MOSFET in a core region is short, so that reduction of consumption power and high-speed operation can be achieved.

Furthermore, in accordance with the LSI device according to the invention, the film thickness of a SOI layer to be an Si channel of a MOSFET is thin in a core region so as to restrain the sort channel effect while the film thickness of a SOI layer to be an Si channel of a MOSFET is thick in an I/O region so as to prevent PD of a MOSFET from occurring, so that a stable circuit operation of the LSI device can be achieved.

Moreover, in accordance with the manufacturing method of an LSI device according to the invention, the film thickness of a SOI layer can be controlled to be a desired value by adjusting the oxidation amount in a process of forming an oxide film, so that the film thickness of an Si channel of a MOSFET of the LSI device to be manufactured can be optionally set in accordance with the channel length or the voltage of a driving source. Thus, the film thickness of the Si channel can be formed so as to correspond to a characteristic required for each region of the LSI device.

In the present invention, a manufacturing method is explained. For example, a method of manufacturing an LSI device comprising a core region to which a first driving voltage is applied and an interface region to which a second driving voltage higher than the above first driving voltage is applied may be claimed. Such method comprises, forming a device separation region for separating a SOI layer of a SOI substrate into a first SOI layer to be the above core region and a second SOI layer to be the above interface region, uniformly oxidizing the vicinity of surfaces of the above first SOI layer and the above second SOI layer to form a second oxide film in areas to be the above core region and the above interface region, eliminating an upper part of the above device separation region and the above second oxide film by means of the CMP method to even surfaces of the above first SOI layer, the above second SOI layer and the above device separation region, selectively oxidizing an area near a surface of the above first SOI layer to form a first oxide film, eliminating the above first oxide film to make the above first SOI layer thinner than the above second SOI layer, and forming in the above core region a plurality of first MOSFETs in which the above first SOI layer is a fully depleted Si channel and forming in the above interface region a plurality of second MOSFETs in which the above second SOI layer is a fully depleted Si channel.

The channel length of the above first MOSFET formed in the above core region is made shorter than the channel length of the above second MOSFET formed in the above interface region. The thickness of the above first SOI layer is 30 nm or less.

What is claimed is:

1. An LSI device comprising:
    an SOI substrate having an SOI layer including a core region to which a first driving voltage is applied and an interface region to which a second driving voltage higher than the first driving voltage is applied;
    a device separation region for separating the SOI layer into the core region and the interface region, wherein a thickness of the SOI layer of the core region is thinner than a thickness of the SOI layer of the interface region;
    a plurality of first MOSFETs formed in the core region and in which the SOI layer of the core region is a fully depleted Si channel; and
    a plurality of second MOSFETs formed in the interface region and in which the SOI layer of the interface region is a fully depleted Si channel,
    wherein the first driving voltage is 1.5 v and the second driving voltage is 3.3 V.

2. The LSI device according to claim 1, wherein a thickness of the SOI layer of the core region is 30 nm or less.

3. The LSI device according to claim 2, wherein a thickness of the SOI layer of the interface region is around 50 nm.

4. An LSI device comprising:
    an SOI substrate having an SOI layer including a core region to which a first driving voltage is applied and an interface region to which a second driving voltage higher than the first driving voltage is applied;
    a device separation region for separating the SOI layer into the core region and the interface region, wherein a thickness of the SOI layer of the core region is thinner than a thickness of the SOI layer of the interface region;
    a plurality of first MOSFETs formed in the core region and in which the SOI layer of the core region is a fully depleted Si channel; and
    a plurality of second MOSFETs formed in the interface region and in which the SOI layer of the interface region is a fully depleted Si channel,
    wherein a channel length of the first MOSFETs formed in the core region are shorter than a channel length of the second MOSFETs formed in the interface region.

5. An LSI device comprising:
    an SOI substrate having an SOI layer including a high speed computing region to which a first driving voltage is applied and an interface region to which a second driving voltage higher than the first driving voltage is applied;
    a device separation region for separating the SOI layer into the high speed computing region and the interface region, wherein a thickness of the SOI layer of the high speed computing region is thinner than a thickness of the SOI layer of the interface region;

a plurality of first MOSFETs formed in the high speed computing region and in which the SOI layer of the high speed computing region is a fully depleted Si channel; and a plurality of second MOSFETs formed in the interface region and in which the SOI layer of the interface region is a fully depleted Si channel, wherein a channel length of the first MOSFETs formed in the high speed computing region are shorter than a channel length of the second MOSFETs formed in the interface region.

6. An LSI device comprising: an SOI substrate having an SOI layer including a high speed computing region to which a first driving voltage is applied and an interface region to which a second driving voltage higher than the first driving voltage is applied;

a device separation region for separating the SOI layer into the high speed computing region and the interface region, wherein a thickness of the SOI layer of the high speed computing region is thinner than a thickness of the SOI layer of the interface region;

a plurality of first MOSFETs formed in the high speed computing region and in which the SOI layer of the high speed computing region is a fully depleted Si channel; and a plurality of second MOSFETs formed in the interface region and in which the SOI layer of the interface region is a fully depleted Si channel, wherein the first driving voltage is 1.5 V and the second driving voltage is 3.3 v.

* * * * *